United States Patent [19]

Van Eijk et al.

[11] Patent Number: 5,051,801
[45] Date of Patent: Sep. 24, 1991

[54] POSITION-SENSITIVE RADIATION DETECTOR

[75] Inventors: Carel W. E. Van Eijk; Eric M. Schooneveld, both of Delft, Netherlands

[73] Assignee: Technische Universiteit Delft, Delft, Netherlands

[21] Appl. No.: 478,265

[22] Filed: Feb. 12, 1990

[30] Foreign Application Priority Data

Feb. 13, 1989 [NL] Netherlands ............... 8900343

[51] Int. Cl.$^5$ ............... H01L 27/14; H01L 29/06; H01L 31/00
[52] U.S. Cl. ............... 357/30; 357/20; 357/32; 357/45
[58] Field of Search ............... 357/30 R, 30 D, 30 F, 357/30 G, 30 H, 30 Q, 20, 32, 45

[56] References Cited

U.S. PATENT DOCUMENTS 3,415,439 12/1968 Skillman .
4,231,052 10/1980 Day et al. ............... 357/30 D
4,688,067 8/1987 Rehak et al. .
4,885,620 12/1989 Kemmer et al. ............... 357/30 G

FOREIGN PATENT DOCUMENTS 0270251 6/1988 European Pat. Off. .
WO/85/049-
87 11/1985 World Int. Prop. O. .

OTHER PUBLICATIONS

Silicon Detectors, by Klanner, pp. 209 to 215, 1985.
Nuclear Instruments and Methods in Physics Research A, vol. 235, 1985, by Rehak et al., pp. 224–234.
Nuclear Instruments and Methods in Physics Research A, vol. 260, 1987, J. Ellison et al., pp. 353–360.
Nuclear Instruments and Methods in Physics Research A, vol. 248, 1986, P. Rehak et al., pp. 367–378.

Primary Examiner—Andrew J. James
Assistant Examiner—Ngan Van Ngo
Attorney, Agent, or Firm—Fleit, Jacobson, Cohn, Price, Holman & Stern

[57] ABSTRACT

Position-sensitive radiation detector provided with a semiconductor structure comprising a wafer of semiconductor material of a first conductivity type having two principal surfaces situated at relatively short distances from each other, the dimensions of which are sufficient to enclose the desired radiation detection surface. An electrode structure is formed on the wafer surfaces such that when suitable voltages are applied to said electrodes two drift fields are generated in the depleted body of the wafer. Detector/amplifier circuits are connected to selected electrodes of the electrode structure to emit, during operation, a start signal at the instant at which charge carriers are generated in the depleted part of the structure as a consequence of incident radiation or elementary particles, and to emit a stop signal at the instant when charge carriers reach a detection electrode of the structure after propagation through both drift fields.

12 Claims, 8 Drawing Sheets

POSITION-SENSITIVE RADIATION DETECTOR

BACKGROUND OF THE INVENTION

The invention relates to a position-sensitive radiation detector provided with a semiconductor structure comprising;

a wafer of semiconductor material of a first conductivity type having two principal surfaces situated at a relatively short distance from each other, the dimensions of which are sufficient to enclose the desired radiation detection surface, an electrode structure composed of one or more strip-type electrode regions of a second conductivity type in the first principal surface and at least one electrode region of the second conductivity type in the oppositely situated part of the second principal surface, voltages being applied, during operation, to the electrodes of the electrode structure which are such that, on the one hand, the part of the semiconductor wafer between the electrodes of the electrode structure is completely depleted and, on the other hand, a drift field is generated in said depleted part of the structure, a detection electrode region, of the first conductivity type provided in one of the principal surfaces, a voltage applied to which during operation is such that mobile charge carriers can be attracted by the drift field, a detector/amplifier circuit connected to the at least one electrode region in the oppositely situated part of the principal surface being designed to emit, during operation, a start signal at the instant at which charge carriers are generated in the depleted part of the structure as a consequence of incident radiation or elementary particles, and a detector/amplifier circuit connected to the detection electrode region being designed to emit, during operation, a stop signal at the instant when charge carriers reach the detection electrode region via the drift field.

A position-sensitive radiation detector of the type described above is disclosed by the U.S. Pat. No. 4,688,067. In said known position-sensitive radiation detector, both the first and the second electrode structures are constructed with the aid of strip-type electrodes which are provided parallel to one another at a short distance from one another in the principal surface concerned of the wafer of semiconductor material. Said known structure is only position-sensitive in one direction, namely in the direction perpendicular to the strip-type electrodes, or in other words, in the direction in which charge carriers which are generated during the detection of radiation will start to move in the drift field which is generated in the wafer of semi-conductor material.

The at least one electrode region mentioned in the second principal surface may be formed by a number of strip-type electrodes as is described in the abovementioned U.S. Pat. No. 4,688,067, but it may also be constructed as a single electrode region such as is described, for example, in the German Offenlegungsschrift 3,415,439. If use is made of a number of strip-type electrodes in the second principal surface, they are preferably capacitively coupled to one another in order to reduce the number of necessary connecting conductors to each of said electrodes for supplying the voltages needed to deplete the semiconductor wafer and to generate the drift field. If use is made of a single electrode region, a capacitive coupling structure does not need to be effected and, in addition, it is possible for a single amplifier to be sufficient to generate the start signal during operation.

If radiation is intercepted or an elementary particle is detected with this known structure, charge carriers will be generated at the position where the radiation is intercepted or where the particle passes through the structure in the wafer of semiconductor material respectively. Depending on the conductivity type used in the semiconductor structure, the charge carriers of the one type will start to move directly in the thickness direction towards one of the electrode regions of the second conductivity type. This charge carrier movement results in the generation of a start signal in a detector/amplifier which is connected to said electrode structure. The charge carriers of the other type will start to move in the drift field approximately parallel to the two principal surfaces until they reach the detection electrode and are attracted by said detection electrode. A stop signal is then generated with the aid of a detector/amplifier which is connected to the detection electrode. The time difference between the start signal and the stop signal is characteristic of the length of the path which the charge carriers concerned have traversed in the drift field and therefore of the position at which the elementary particle was intercepted in the wafer of semiconductor material.

Further details relating to the operation of such a known position-sensitive radiation detector may be found not only in the abovementioned US Pat. No. 4,688,067 and the German Offenlegungsschrift 3,415,439 mentioned, but also in the following articles:

"Silicon detectors" by R. Klanner in Nuclear Instruments and Methods in Physics Research A235 (1985), pages 209-215, "Semiconductor Drift Chambers for Position and Energy Measurements" by P. Rehak et al. in Nuclear Instruments and Methods in Physics Research A235 (1985), pages 224-234, "Progress in Semiconductor Drift Detectors" by P. Rehak et al. in Nuclear Instruments and Methods in Physics Research A248 (1986), pages 367-378, and "Evaluation of Prototype Silicon Drift Detectors" by J. Ellison et al. in Nuclear Instruments and Methods in Physics Research A260 (1987), pages 353-360.

Attempts have already been made to design a position-sensitive radiation detector with two-dimensional position sensitivity. A brief description of an example thereof is to be found in the abovementioned paper entitled "Silicon Detectors" by R.Klanner, in particular FIG. 7 and the associated description on page 212. The detector structure shown in said figure comprises a detection electrode, designated as the anode, which is not constructed as a single strip-type electrode but is constructed as a row of separate anode regions, each connected to its own electronic amplifier circuit. If an elementary particle is intercepted at a certain position in this detector structure or if radiation is intercepted, this will release charge carriers. Depending on the polarity, some of these charge carriers will start to move in the drift field towards the segmented anode or detection electrode. The drift time to the anode is again characteristic of the distance traversed to the anode and is consequently characteristic of the position coordinate. The position of said anode region which emits the stop signal at the end of the drift period is characteristic of the other position coordinate.

A disadvantage of such a structure is that each anode segment requires its own read-out amplifier. With a relatively low resolution and a relatively large length dimension of the anode as a whole, it may be necessary to use a few tens up to even many hundreds of amplifiers to make such a structure function with the desired accuracy.

SUMMARY OF THE INVENTION

The object of the invention is to specify the manner in which a position-sensitive detector has to be constructed in order to obtain a two-dimensional position sensitivity without having to use large numbers of electronic circuits in connection with reading out the detection signals.

In a position-sensitive radiation detector of the type mentioned in the introduction, this object is met in that the semiconductor structure further comprises:

at least one further electrode structure composed of one or more electrode regions of the second conductivity type in the first principal surface and at least one electrode region of the second conductivity type in the oppositely situated part of the second principal surface, voltages being applied, during operation, to the electrodes of the further electrode structure, which voltages are such that, on the one hand, the part of the semiconductor material wafer between the electrodes of the further electrode structure is completely depleted and, on the other hand, a further drift field is generated in said depleted part of the structure, and the further electrode structure being positioned with respect to the first mentioned electrode structure and with respect to the detection electrode region in a manner such that charge carriers originating from the drift field within the first mentioned electrode structure will be intercepted in the drift field within the further electrode structure and will be able to reach the detection electrode region via said further drift field.

If radiation is intercepted or if interaction occurs with an elementary particle at a particular position in such a structure, charge carriers will be generated at the position in the same manner as is described above. The charge carriers of the one type will again immediately start to move towards one of the electrode regions of the second conductivity type and the charge carriers of the other type will start to move in the first drift field in the direction of the further electrode structure. As soon as said charge carriers reach the further electrode structure, they find themselves in the further drift field which is applied to said electrode structure with the aid of the diverse voltages. In said further drift field, the charge carriers are then propelled until they reach the detection electrode at the end of said further drift field. The time which the charge carriers need to traverse the first drift field is characteristic of a first position coordinate while the time which the charge carriers need to subsequently traverse the second drift field is characteristic of a second position coordinate.

If the two drift fields are perpendicular to each other and if a coordinate system is chosen whose X axis runs parallel to the one field, the Y axis running parallel to the other field, the abovementioned coordinates may be regarded as X coordinate and Y coordinate. However, the two fields may also make an optional and different angle with each other, in which case said angle, together with the two coordinates mentioned, provides sufficient information to determine the position at which the radiation was intercepted.

A relatively simple embodiment is characterized in that the said electrode regions of the second conductivity type in the first principal surface, associated with the further electrode structure, are constructed as small islands or pixel regions and that the electrode region of the second conductivity type in the oppositely situated part of the second principal surface is constructed as a strip-type region.

In order to be able to determine the drift times through the two drift fields separately, it is necessary not only to generate a start and a stop signal in the manner as is already described above, but it is also necessary to generate an intermediate time signal which indicates the instant at which the charge carriers leave the first drift field and start to move in the second drift field. Although diverse possibilities are available for generating such an intermediate time signal, it is preferable in the abovementioned simple embodiment that the electrode region of the second conductivity type in the oppositely situated part of the second principal surface and associated with the further electrode structure is connected, during operation, to a detector/amplifier circuit designed to emit an intermediate time signal at the instant at which charge carriers moving through the drift field pass through said electrode region.

A further embodiment of the radiation detector has the characteristic that the electrode region of the second conductivity type in the second principal surface, associated with the first mentioned electrode structure, and the electrode region of the second conductivity type in the second principal surface, associated with the further electrode structure, are integrally combined.

This last mentioned embodiment has, in particular, the advantage that it is necessary only to provide a single large-scale doping in the second principal surface, which requires no further processing. It is only in the first principal surface that there is a multiplicity of separate electrode regions which require a plurality of manufacturing steps.

If this last embodiment is used, it is preferable that the last strip-type electrode region in the first principal surface, viewed in the direction of movement of the charge carriers and associated with the first mentioned electrode structure, is connected, during operation, to a detector/amplifier circuit designed to emit an intermediate time signal at the instant at which the charge carriers moving through the drift field pass through said electrode region.

In the embodiments described above, the two drift fields are separately generated with, in particular, electrode structures designed for the purpose. However, it is also possible to create a drift field in a predetermined direction as a result of two other drift fields. An embodiment of a position-sensitive radiation detector according to the invention in which drift fields are created in this manner has the characteristic that, like the first mentioned electrode structure, the further electrode structure is composed of strip-type electrode regions, that the strip-type electrode regions of the first mentioned electrode structure make an angle with the strip-type electrode regions of the further electrode structure, that the strip-type electrodes of both structures are connected to one another to form angled electrodes, the apexes being situated on a diagonal, that the electrodes of the second conductivity type in the second principal surface are composed of a strip-type electrode under the said diagonal as well as integrated electrode regions under the remaining parts, of the strip-type electrode regions, and that a detection electrode is used which is positioned near the apex of the last angled electrode, viewed in the drift direction.

This embodiment has, in particular, the advantage that a potential jump does not occur when the charge carriers transfer from the one drift field to the other drift field. In general, such a potential jump will in fact occur in the embodiments described previously.

The width of the diverse strip-type electrodes (the dimension in the drift direction of the charge carriers) has to be chosen in a manner which guarantees an adequate homogeneity of the drift field.

In the exemplary embodiments which are given in the abovementioned literature, use is made, without exception, of a wafer of semiconductor material of the n-type, the first and second electrode structures being provided as p-doped regions in the wafer of n-type material, while the anode or detection electrode is effected with the aid of an n+-doped region.

In n-type material, the positive charge carriers, or holes, which are generated when radiation is intercepted or when an elementary particle interacts, will start to move towards the nearest p+ region associated with the first electrode structure. The negative charge carriers, or electrons, will start to move in the drift field and will ultimately reach the anode, or detection electrode.

Holes have a velocity which is roughly three time lower than that of electrons. If the drift time is measured with the same absolute precision, the positional resolution will therefore be three times greater if p-type silicon is used for the wafer of semiconductor material than if n-type silicon is used. If X-ray radiation is absorbed in high-resistivity p-type silicon, the definition of the start time is just as precise, or on average even more precise, depending on the radiation energy, than for detection in high-resistivity n-silicon. If p-type silicon is used, the contribution of the absorption process to the positional inaccuracy is thus roughly three times lower than if n-type silicon is used. As a consequence of the diffusion during the drift process, the precision in the definition of the stop time of holes is three times poorer than that of electrons. Because the drift time of wholes in p-type silicon is three times greater than that of the electrons in n-type silicon, this results in a contribution of the stop signal to the positional resolution which is approximately equal in both cases. All in all, it therefore appears that the positional resolution is better if p-type silicon is used.

It is therefore preferable that the first conductivity type in the position-sensitivity radiation detector according to the invention is of the p-type.

BRIEF DESCRIPTION OF THE DRAWINGS

The invention will be explained in more detail below with reference to the accompanying figures.

Finally

DETAILED DESCRIPTION OF THE PREFERRED EMBODIMENT

Figure 1:
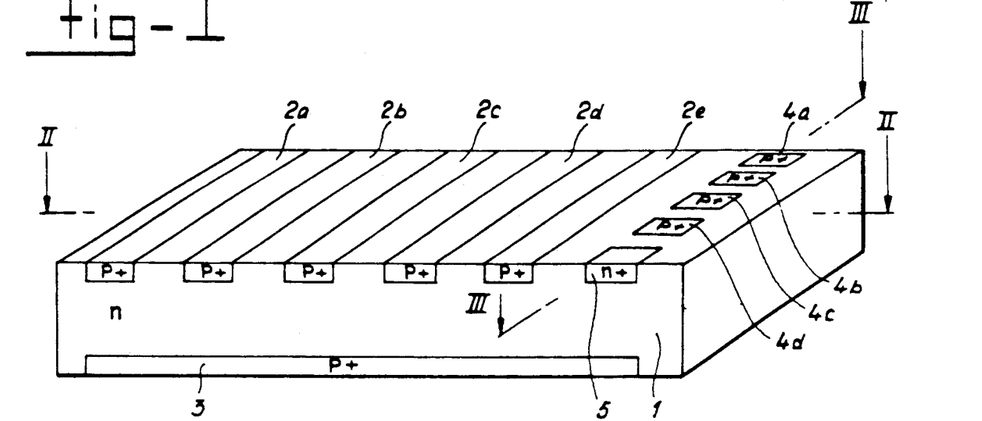
FIG. 1 shows diagrammatically a perspective view of a position-sensitive radiation detector according to the invention in which the semiconductor wafer is composed of n-type material.

FIG. 1 shows diagrammatically a perspective view of a position-sensitive radiation detector according to the invention. The detector is produced in a wafer of semiconductor material 1 for which semiconductor material of the n-type is chosen in FIG. 1. Strip-type regions 2a, 2b, 2c, 2d, 2e of p+-type material are provided in the top surface of the wafer 1. Furthermore, a row of relatively small regions 4a, 4b, 4c, 4d, also of p+-type material, is provided parallel to the last strip-type electrode 2e and, finally, a single n+-type region 5, which serves as anode, or detection electrode, is provided in line with said row. Finally, a large-scale electrode region 3 of the p+-type is provided in the bottom surface of the wafer 1. The diverse regions are produced in the semiconductor material with the aid of a process which is known per se. Such processes are known to the person skilled in the art and a detailed discussion thereof is deemed superfluous.

Figure 2:
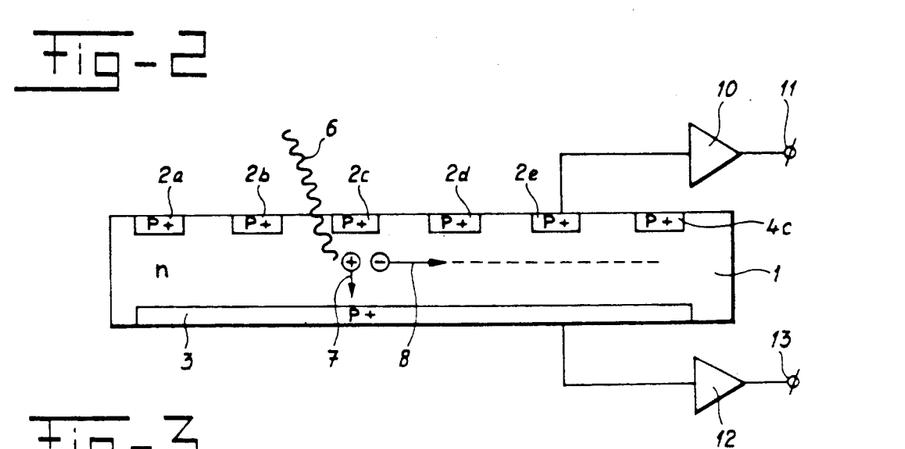
FIG. 2 shows a diagrammatic section as indicated by the arrows II—II in FIG. 1, which section is used to explain the operation of the detector.

The operation of the detector from FIG. 1 will be discussed below with reference to the diagrammatic sections in FIGS. 2 and 3. FIG. 2 shows a section as indicated by the arrows II—II in FIG. 1. Corresponding parts are indicated by like reference numerals. In FIG. 2, an electronic amplifier/detector circuit 10 is furthermore connected between the p+-type electrode strip 2e and an intermediate time signal output 11. The electrode strip 2e is the electrode strip which is adjacent to the row of small areas 4a.... 4e. Furthermore, FIG. 2 shows the amplifier/detector circuit 12 which is connected between the lowermost electrode 3 and a start signal output 13.

During operation, voltages are furthermore applied to the electrodes 2a .... 2e, 3, 4a .... 4d which result first and foremost in the formation of depletion regions under the detectors 2a .... 2e and 4a .... 4d, or above the electrode 3 (as seen in FIG. 2). The voltages have to be sufficiently high to ensure that the depletion regions merge into one another and the wafer of semiconductor material 1 is completely depleted. If the voltages are furthermore chosen in a manner such that the electrode 3 carries a relatively high voltage while the electrodes 2a through 2e inclusively and in that order carry lower voltages in each case (but still high enough to deplete the wafer 1), a field will be generated in the wafer 1 having a potential valley at the electrode 2e. The result of this drift field in the central portion of the wafer 1 is that negative charge carriers which find themselves in said field will start to move from left to right in FIG. 2.

For a more detailed description of the manner in which such a drift field can be generated, reference is made to the previously mentioned literature.

If, for example, an X-ray quantum 6 is now absorbed, a multiplicity of electron-hole pairs will consequently be generated at the position of the absorption, as indicated diagrammatically in FIG. 2. The holes will in this case be attracted by the electrode 3, as indicated by the arrow 7. Owing to the presence of the abovementioned drift field, however, the electrons will start to move, as indicated by the arrow 8, from left to right towards the electrode 2e, which has the highest potential of all the electrodes 2a .... 2e.

The holes which are attracted, as indicated by the arrow 7, by the lowermost electrode 3 provide for the generation of a start signal which is fed via the detector/amplifier circuit 12 to the start signal output 13. Said start signal marks the instant at which the quantum 6 was absorbed. As soon as the electrons have been moved in the drift field to beneath the last strip-type electrode 2e, an intermediate time signal will be generated in the detector/amplifier 10, which signal is emitted at the output 11.

Figure 3:
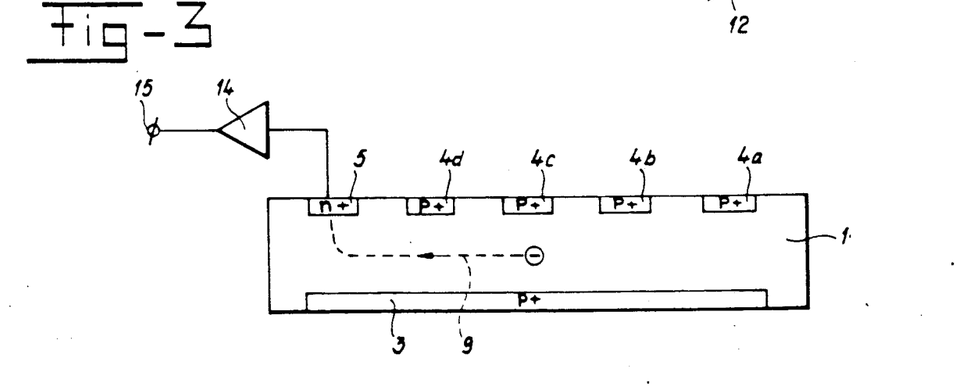
FIG. 3 shows a section as indicated by the arrows III—III in FIG. 1, which section is also used to explain the operation of the detector.

FIG. 3 illustrates a section through the detector from FIG. 1 as indicated by the arrows III—III. Said section shows the pixel electrodes 4a .... 4d and the anode or detection electrode 5, together with the continuous electrode 3 present at the bottom of the wafer 1. The anode or detection electrode 5 is connected via a detector/amplifier 14 to a stop signal output 15.

Voltages are also applied to the relatively small electrode regions or pixel regions 4a .... 4d to deplete the central part of the wafer 1 and to generate a drift field beneath this row of electrode regions 4a .... 4d, specifically in a manner such that the lowest voltage is applied to the region 4a while the highest voltage is applied to the region 4d, as a result of which a drift field is created which will move electrons in the direction running from the region 4a to the region 4d. Furthermore, the voltage which is impressed on the region 4a is higher than the voltage which is applied to the strip electrode 2e.

The electrons, which are moved, as indicated by the arrow 8, past the last strip-type electrode 2e, find themselves, in this example, near the pixel region 4c and are intercepted at that point in the drift field which is created below the pixel electrodes 4a 4d. This means that the direction in which electrons move will rotate through 90°. In FIG. 3, the electrons appear in the plane of the drawing below the pixel electrode 4c and start to move to the left from that point in the direction of the anode or detection electrode 5. Since the anode or detection electrode 5 is held at the highest potential, the electrons which have traversed the drift field below the pixel electrodes 4a .... 4d will be intercepted by the anode. At the instant at which that takes place, the amplifier/detector 14 will emit a stop signal to the stop signal output 15.

It will be clear that, assuming a known drift velocity of both holes and electrons, the time interval which elapses between the occurrence of the start signal at the output 13 and the intermediate time signal at the output 11 is characteristic of the distance which has been traversed between the position at which the electron-hole appears have been generated and the last strip-type electrode 2e, while the time interval which elapses between the occurrence of the intermediate time signal at the output 11 and the stop signal at the output 15 is characteristic of the position at which the electrons find themselves in the field below the pixel electrodes 4a .... 4d and the anode 5 which ultimately absorbs the drifting charge carriers. From these data, the position at which the charge carriers where generated, in other words the position where the X-ray quantum 6 was absorbed, can be determined precisely.

Figure 4:
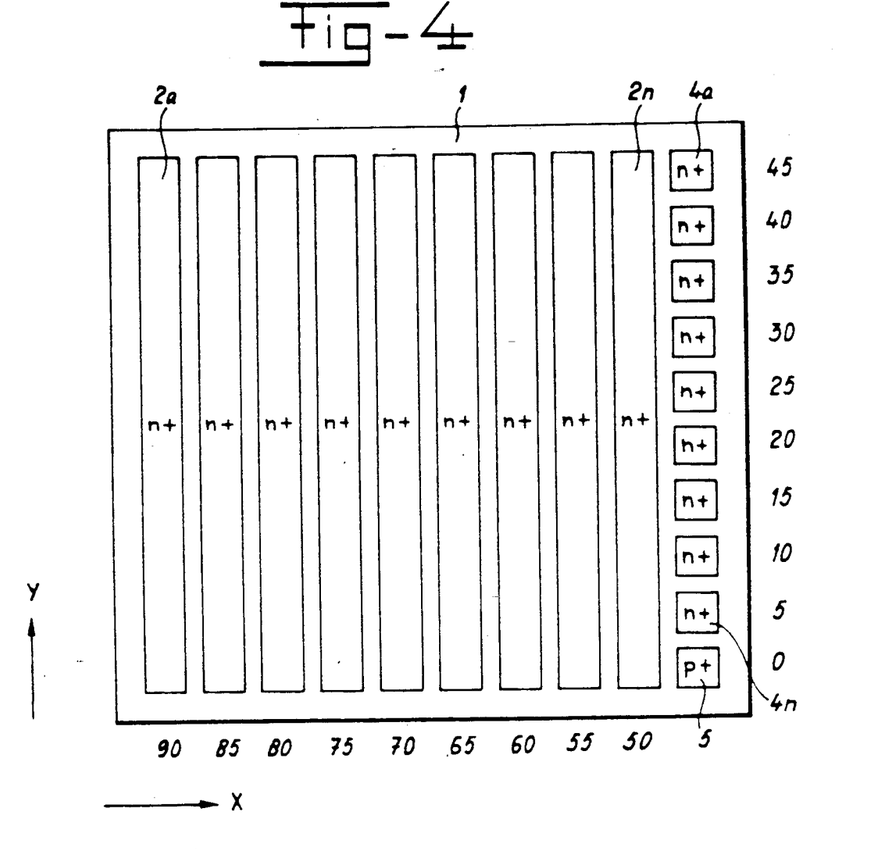
FIG. 4 shows a plan view of a preferred embodiment of the detector in which the semiconductor wafer is composed of p-type material, the diverse drift electrode regions being produced from n-type material and the anode or detection electrode being produced from p-type material.

Although a wafer of semiconductor material 1 of the n-type was assumed above, it is preferable to use a wafer of semiconductor material of the p-type. In that case, the electrodes 2a .... 2e, 3 and 4a .... 4d will have to be produced from $n^+$-type material, while the anode or detection electrode 5 will have to be produced from $p^+$-type material. FIG. 4 shows a plan view of an embodiment in which this choice of material has been used. In this embodiment, the strip-type electrodes are not individually provided with reference numerals. Only the first and last electrodes 2e and 2n are indicated as such. The pixel electrodes 4 are also not provided individually with reference numerals, only the first and last pixel electrodes being indicated by 4a and 4n. The anode or detection electrode is indicated by 5 and the semiconductor material is itself indicated by 1. In FIG. 4, the large-scale electrode 3 at the bottom of the wafer is, of course, not visible.

It will be clear, that if p-type material is used for the semiconductor wafer, the voltages which have to be supplied to the diverse electrodes to generate the drift fields must also have a reversed polarity. In FIG. 4, a plurality of voltage values is specified next to the respective electrodes as an example. If a voltage of, for example, 125V is applied to the lowermost electrode 3, which is not visible in this figure, and if the voltages whose values are specified in the figure are applied to the other electrodes 2a .... 2n and 4a ..... 4n and 5, the semiconductor wafer is, on the one hand, fully depleted and, on the other hand, two drift fields, which are in this case perpendicular to each other, are produced in the same manner as has been discussed above. If radiation is detected, said drift fields will transport the holes generated thereby from the position at which the radiation has struck the detector to the anode 5 in the manner discussed above.

As has already been noted, the use of p-type silicon is preferable because the transport of holes takes place roughly three times more slowly than the transport of electrons. This difference in velocity is of crucial importance for the positional resolution of the drift detector.

Diverse simulations have shown that the use of p-type silicon, in which holes which are propelled in the drift fields are the charge carriers, results in a higher resolution.

Figure 5:
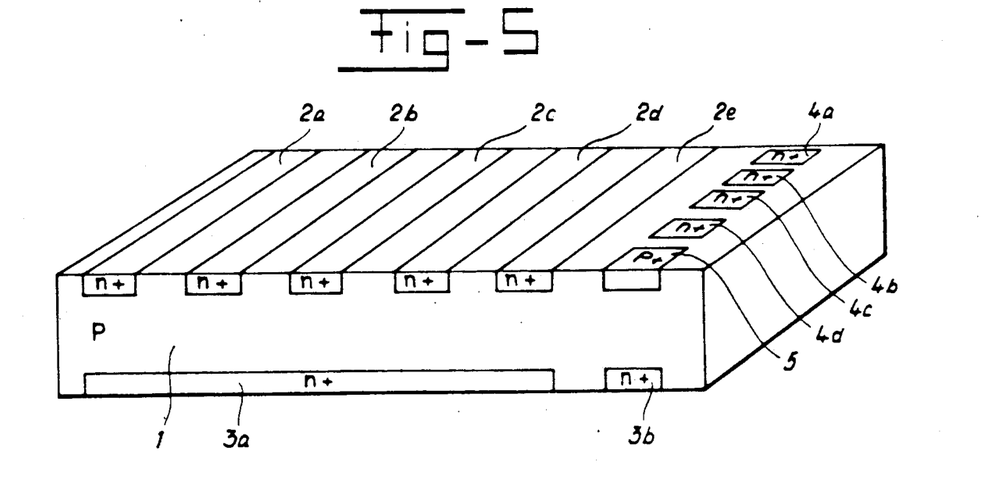
FIG. 5 shows an embodiment of a position-sensitive radiation detector according to the invention in which both electrode structures each have a separate electrode in the second, in this case the lowermost, principal surface of the structure.

FIG. 5 shows a further embodiment, in which use is made of a semiconductor wafer of p-type material, electrode regions which are constructed in n+-type material and a detection electrode which is constructed in p+-type material. The structural difference between the embodiment of FIG. 5 and that of FIG. 1 is to be found in the configuration of the electrodes which are situated in the bottom surface of the wafer 1. In FIG. 5, the electrode region 3a interacts with the strip-type electrodes 2a .... 2e, while a separate electrode 3b, in this case of strip-type construction, interacts with the pixel regions 4a .... 4d. In such a configuration, the amplifier which is used to generate the intermediate timesignal can be connected to the strip-type electrode 3b.

Figure 6A:
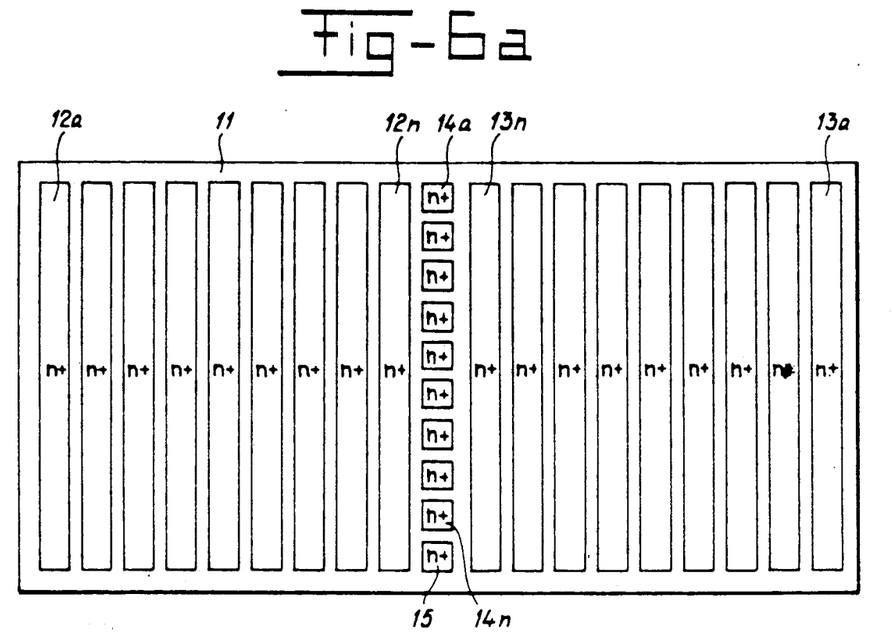
FIGS. 6a and 6b show views of, respectively, the electrode structure in the first principal surface and the electrode structure in the second principal surface of a position-sensitive radiation detector in which two structures as illustrated in FIG. 4 are combined in a manner such that a symmetrical structure is obtained in which the pixel regions are situated on the axis of symmetry.
Figure 6B:
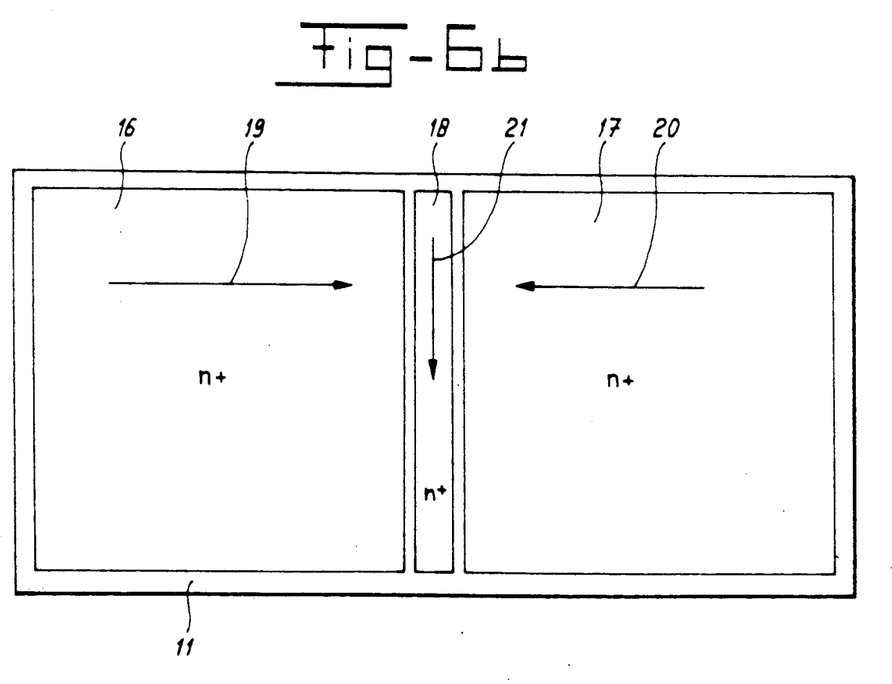

It is possible to develop a multiplicity of composite embodiments on the basis of the embodiment which is illustrated in FIG. 5. A first composite embodiment is shown in FIG. 6. FIG. 6a shows a plan view of the electrode structure in the top surface of the semiconductor material while FIG. 6b shows the associated electrode structure in the bottom surface of the semiconductor structure. A row of strip-type electrodes 12a .... 12n is provided in the top surface of the semiconductor wafer 11 on the left-hand side in FIG. 6a, while the electrodes 13a .... 13n are provided in the right-hand half of the structure. The pixel regions 14a .... 14n are situated in the centre on the line of symmetry of the structure. If the starting point is p-type material for the semiconductor wafer 11, all the electrode regions 12a .... 12n, 13a 13n and 14a .... 14n are constructed in n+-type material. The detection electrode 15 is positioned at the end of the row of pixel regions 14a .... 14n.

In the bottom surface shown in FIG. 6b only three electrode regions are indicated by 16, 17 and 18. The electrode region 16 interacts with the strip-type electrodes 12a .... 12n. The electrode region 17 interacts with the strip-type electrodes 13a .... 13n and the central strip-type electrode 18 interacts with the pixel regions 14a ....14n.

If voltages such as those illustrated, for example, in FIG. 4 are fed to the electrodes of both the left-hand and right-hand half of the structure, the semiconductor wafer is, in the first place, completely depleted, while in the second place, a multiplicity of drift fields is produced whose directions are indicated by the arrows 19, 20 and 21 in FIG. 6b.

If charge carriers are released in the structure of FIG. 6a as a consequence of incident radiation or interaction with an elementary particle, for example in the left-hand section of the structure, some of said charge carriers will move directly to the n+-type region and result in the generation of a start signal via the start signal amplifier connected thereto, in a manner similar to that discussed above with reference to FIGS. 1 et seq. In the structure of FIG. 6b, this amplifier, which is not shown in the figure for the sake of clarity, may be connected to the electrode region 16. The other charge carriers will start to move in the drift field as indicated by the arrow 19 until they find themselves in the drift field between the electrodes 14a to 14n inclusively and the electrode 18 interacting therewith, which drift field is indicated by the arrow 21. The charge carriers will then be transported in the direction of the detection electrode 15 via said drift field. The arrival of the charge carriers from the drift field 19 in the drift field 21 can be detected with an intermediate time amplifier which may be connected to the electrode region 18. The ultimate arrival of the charge carriers at the detection electrode 15 is again detected with the aid of an amplifier which is connected to said detection electrode 15.

If charge carriers are released in the right-hand half of the structure as a consequence of incident radiation, they will initially start to move in the drift field whose direction is indicated by the arrow 20 and will subsequently be transported in the intervening drift field as indicated by the arrow 21 to the detection electrode 15. In this case, the start signal is generated with the aid of an amplifier which is connected to the electrode region 20 and the intermediate time signal originates from the already mentioned amplifier connected to the electrode 18, while the stop signal is delivered by the amplifier which is connected to the detection region 15.

Instead of three separate electrode regions 16, 17, 18, a single integrated electrode may be used in the bottom surface, in a manner similar to that illustrated in FIG. 1. This embodiment is not shown separately in the figures. In that case, the start signal amplifier has to be connected to said single electrode in the bottom sur-face, while each of the electrodes 12n and 13n has to be connected to an intermediate time signal amplifier. The stop signal amplifier is again connected to the anode 15.

It is further pointed out that in FIG. 6, the number of electrodes 12a .... 12n is equal to the number of electrodes 13a .... 13n. These numbers do not, however, necessarily have to be equal to each other. If desired, the number of electrodes in the left-hand half of the structure (n) may be chosen so as to differ from the number of electrodes in the right-hand half of the structure (in this case, equal to m).

Figure 7A:
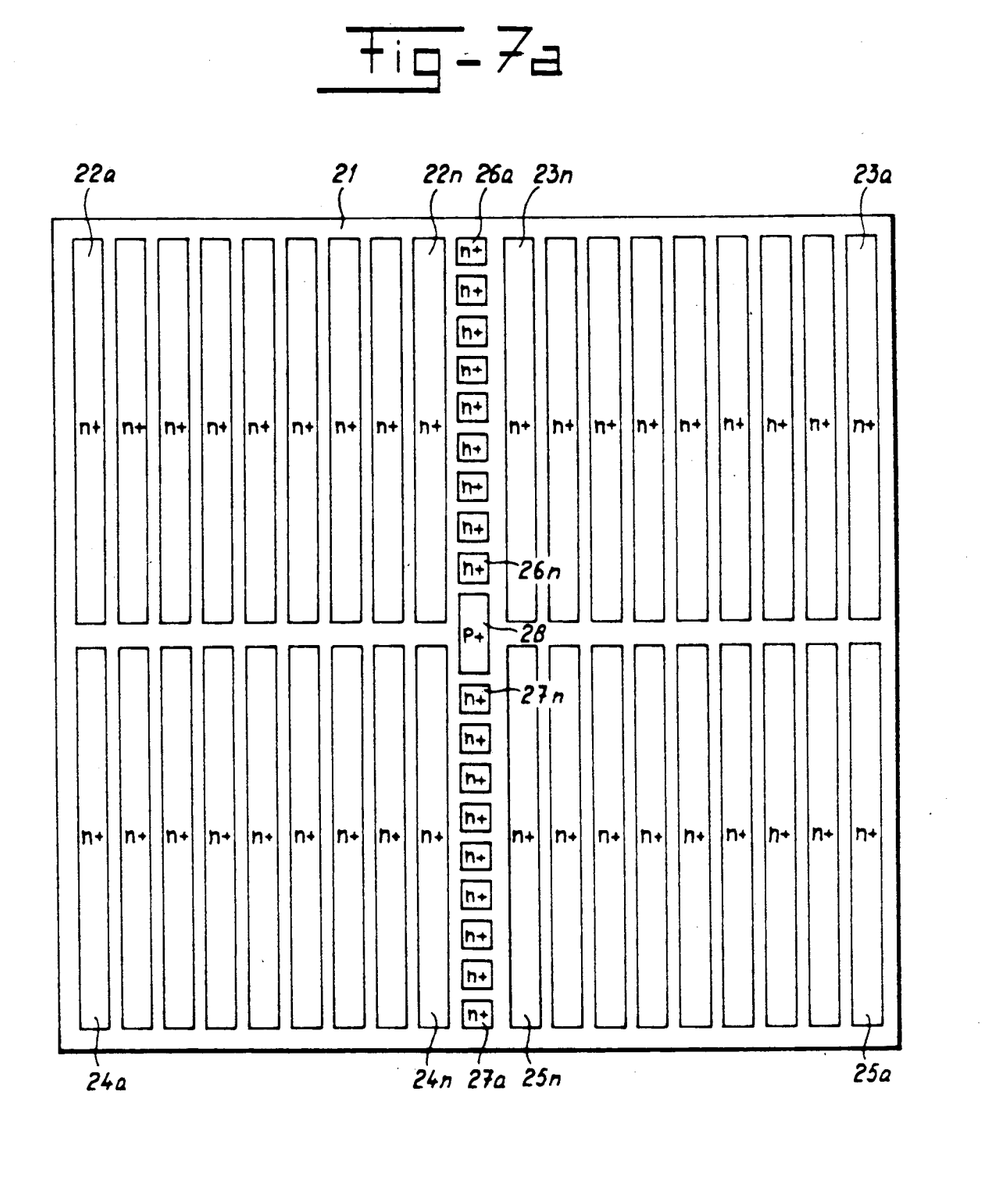
FIG. 7a and 7b show a further embodiment of a position-sensitive radiation detector in which two structures as illustrated in FIGS. 6a and 6b are combined to form a symmetrical structure having an axis of symmetry for the central detection electrode region which extends perpendicular to the first mentioned axis of symmetry.
Figure 7B:
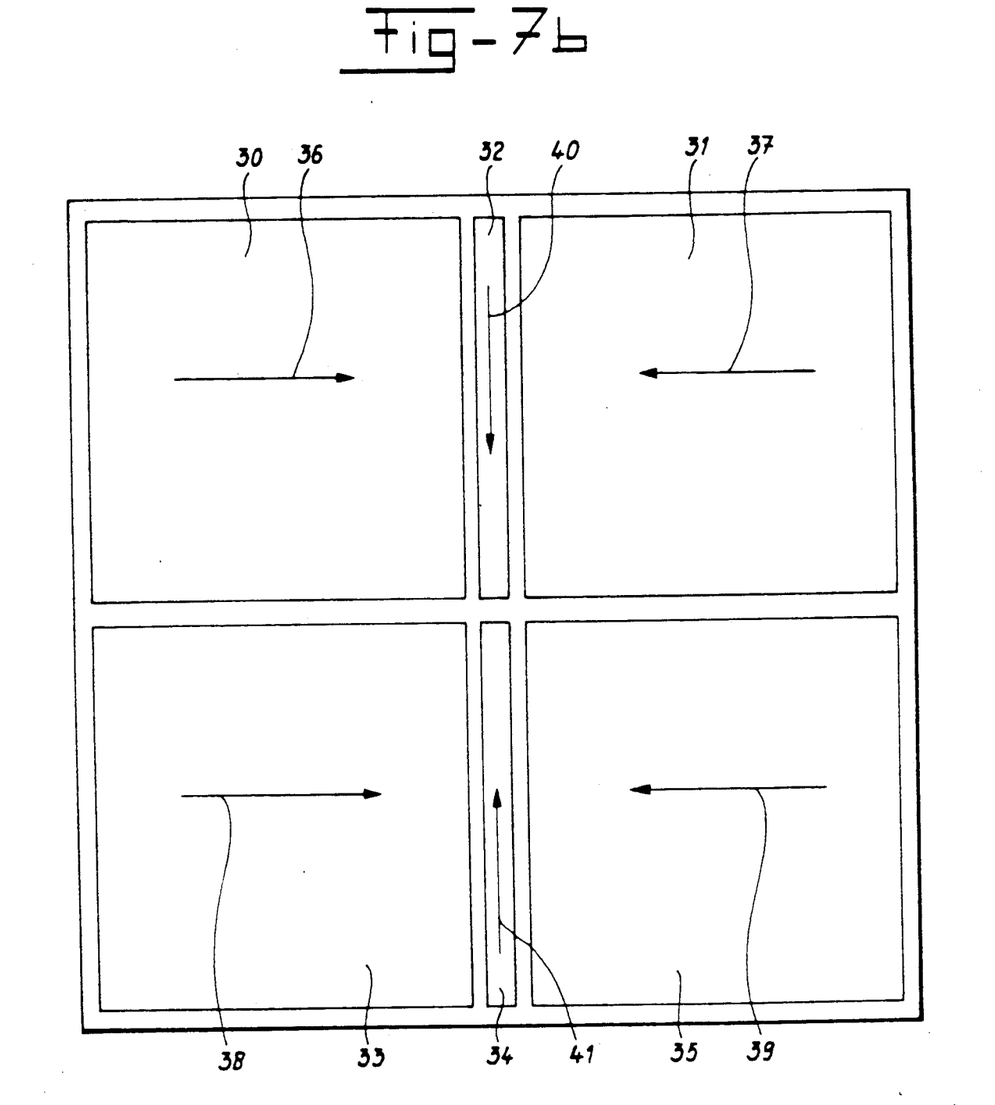

By forming a mirror image of the structure from FIG. 6 around a further axis of symmetry, the structure in FIG. 7 is obtained. In particular, FIG. 7a shows a plan view of the electrode structure in the top surface of the semiconductor material wafer, while FIG. 7b shows the electrode structure in the bottom surface of the wafer of semiconductor material. The diverse electrodes in the top surface are indicated by the reference numerals 22a .... 28. The semiconductor wafer itself has the reference numeral 21.

The electrodes in the bottom surface have the form illustrated in FIG. 7b and are indicated by the reference numerals 30 .... 35.

The fields which are generated in the depleted semiconductor wafer on applying the correct voltages to the diverse electrodes are shown diagrammatically with the aid of the arrows 36 .... 41 in FIG. 7b. After the detailed discussion of the embodiments from the previous figures, a more detailed discussion of this embodiment is deemed superfluous.

In this embodiment, too, the separate electrode regions 30 ... 35 in the bottom surface may be replaced by an integrated large-scale electrode. In that case, four intermediate time amplifiers which have to be connected to the electrodes 22n, 23n, 24n and 25n in the top surface of the structure have to be used. The single large-scale electrode in the bottom surface is connected to the start signal amplifier while the anode 28 is connected to the stop signal amplifier.

As was pointed out previously, the use of a single large-scale electrode in the bottom surface has the advantage that the bottom surface does not have to be processed in a detailed manner, with the result that a single doping step is sufficient to produce the respective electrode in the bottom surface.

Figure 8A:
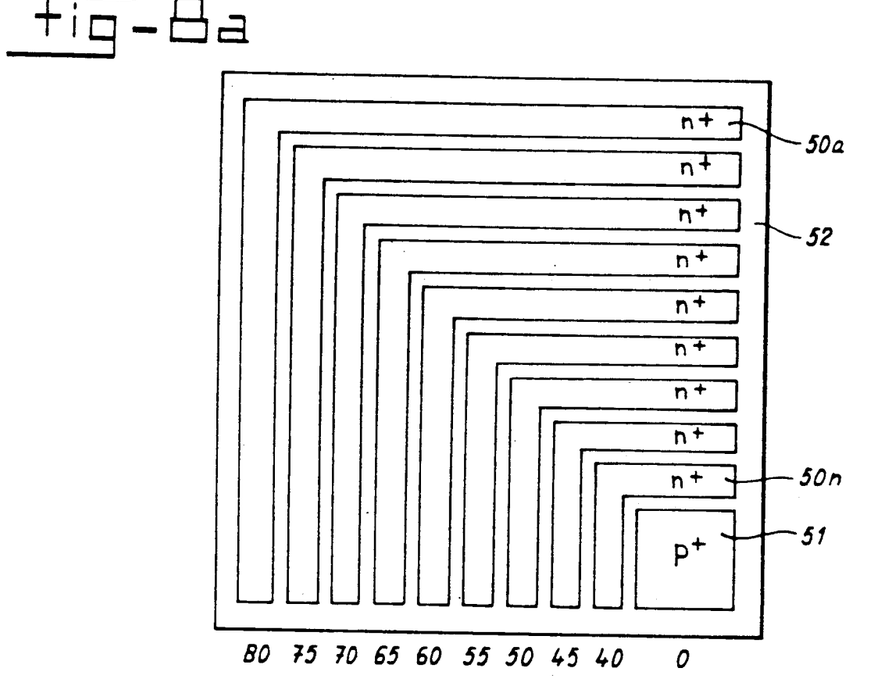
FIGS. 8a and 8b show an embodiment of a position-sensitive radiation detector according to the invention in which both electrode structures are connected to each other in pairs in a manner such that angled electrodes are obtained.
Figure 8B:
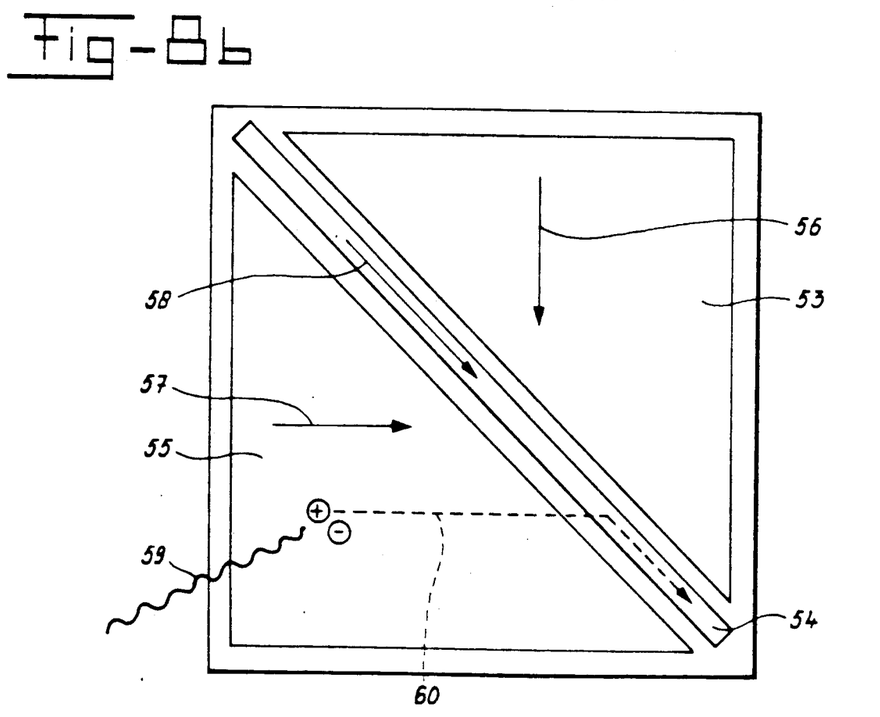

Another embodiment of a radiation detector according to the invention is shown in FIGS. 8a and 8b. In this embodiment, a structure of angled electrodes is provided in the top surface of the wafer of semiconductor material 52, which electrodes are indicated by 50a .... 50n. The detection electrode 51 is furthermore situated in the right-hand bottom corner of the top surface.

In the bottom surface, two triangular electrodes 53 and 55 are provided with a strip-type electrode 54 in between.

If voltages whose values are indicated, for example, at the bottom of FIG. 8a are fed to the strip-type electrodes 50a .... 50n and if the electrode regions 53, 54 and 55 are connected, for example, to a voltage of 100V, the entire wafer of semiconductor material is depleted, while at the same time two drift fields, which are perpendicular to each other, are created in the wafer 52 as a consequence of the various voltages applied to the angled electrodes 50a .... 50n. Said drift fields create a resultant which extends diagonally under the apexes of the angled electrodes 50a to 50n inclusively and terminates in the detection region 51. This diagonal resultant is diagrammatically indicated by the arrow 58.

If charge carriers are released in the structure of FIG. 8, for example, as a consequence of radiation 59 in the manner illustrated in FIG. 8b, charge carriers will be released as a result. Assuming p-type material for the semiconductor body 52, the electrons will be captured immediately after generation by the electrode 55 and will cause a start signal to be generated via the amplifier connected thereto. The holes will start to move along the arrow 60 indicated by a broken line, initially parallel to the arrow 57 and, as soon as the diagonal electrode 54 is reached, parallel to the arrow 58. When the electrode 54 is reached, an intermediate time signal is generated by the intermediate time amplifier connected thereto and, as soon as the holes eventually reach the p-type region 51, a stop signal will be generated as a consequence thereof. In this case, too, the time differences between start signal, intermediate time signal and stop signal will contain sufficient information to calculate exactly the position at which the radiation 59 was intercepted in the structure.

In the embodiment of FIG. 8, use cannot be made of a large-scale electrode in the bottom surface instead of the electrode regions 53, 54 and 55 illustrated in FIG. 8b. The diagonal striptype electrode 54 is needed in this embodiment to connect the intermediate time signal amplifier (which is not shown in the figures). The triangular electrode regions 53 and 55 are each connected to a start signal amplifier, while the anode 51 is connected to a stop signal amplifier.

Balanced against this is the fact that in this embodiment no potential jump occurs at the instant at which the charge carriers transfer from one field to the other field. The distribution of potential in the field 58 is matched to the distribution of potential in the fields 56 and 57. In contrast to this, a potential jump will indeed occur in the embodiments described earlier. Referring to FIG. 4, charge carriers which, for example, are moving through the first drift field level with the pixel region 4n, will successively pass electrodes on which there are voltages of 90, 85, 80 and 50V. However, the charge carriers then find themselves via a potential jump under the pixel electrode 4n which carries a potential of only 5V. Such a potential jump does not occur in the embodiment of FIG. 8.

Although the electrodes in the top surface in FIG. 8 are angled at 90°, any other desired angular values may also be chosen.

Figure 9A:
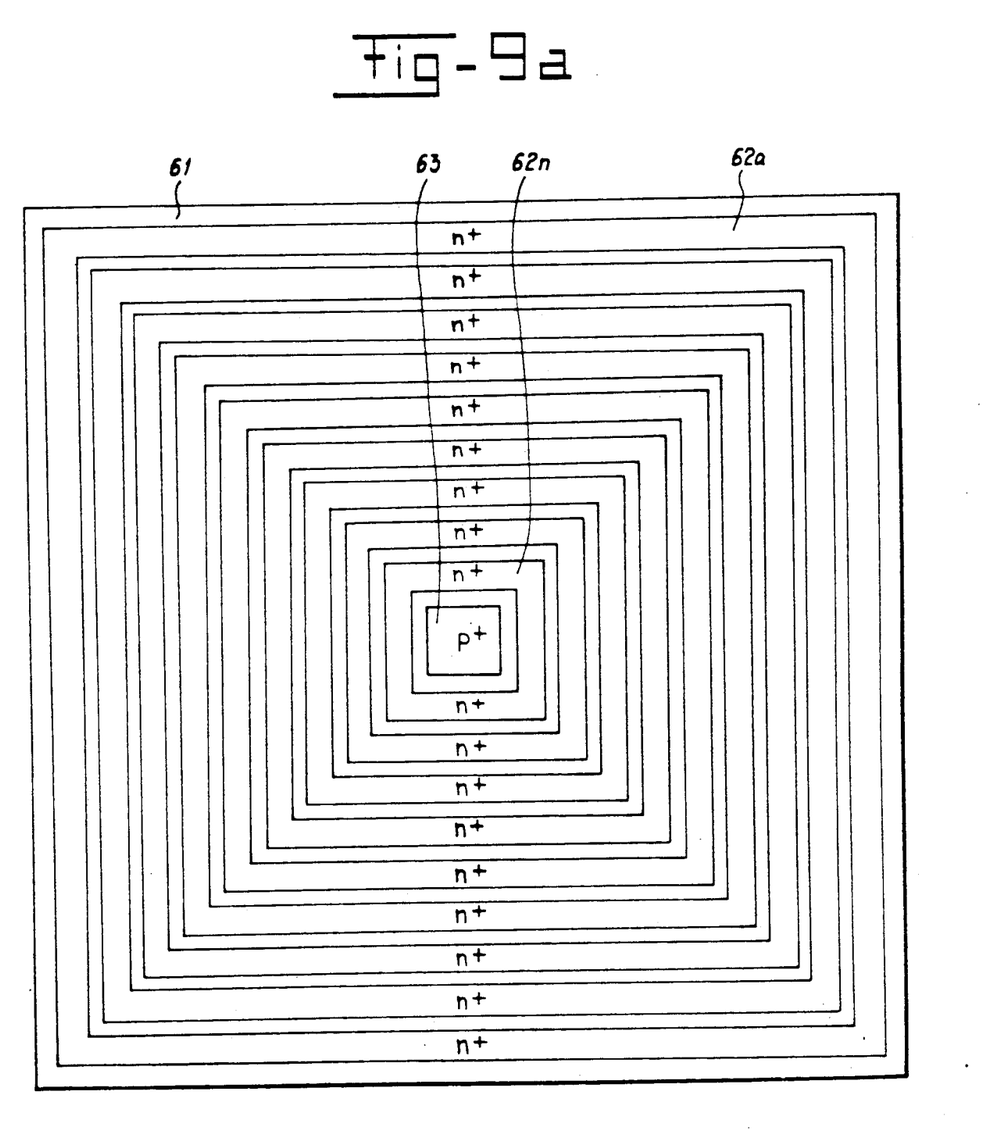
FIGS. 9a and 9b show a further development of the embodiment of FIG. 8 in which a multiplicity of the structures shown in FIG. 8 is combined to form a large-scale position-sensitive radiation detector having concentrically positioned, polygonal closed drift electrodes and a central detection electrode.
Figure 9B:
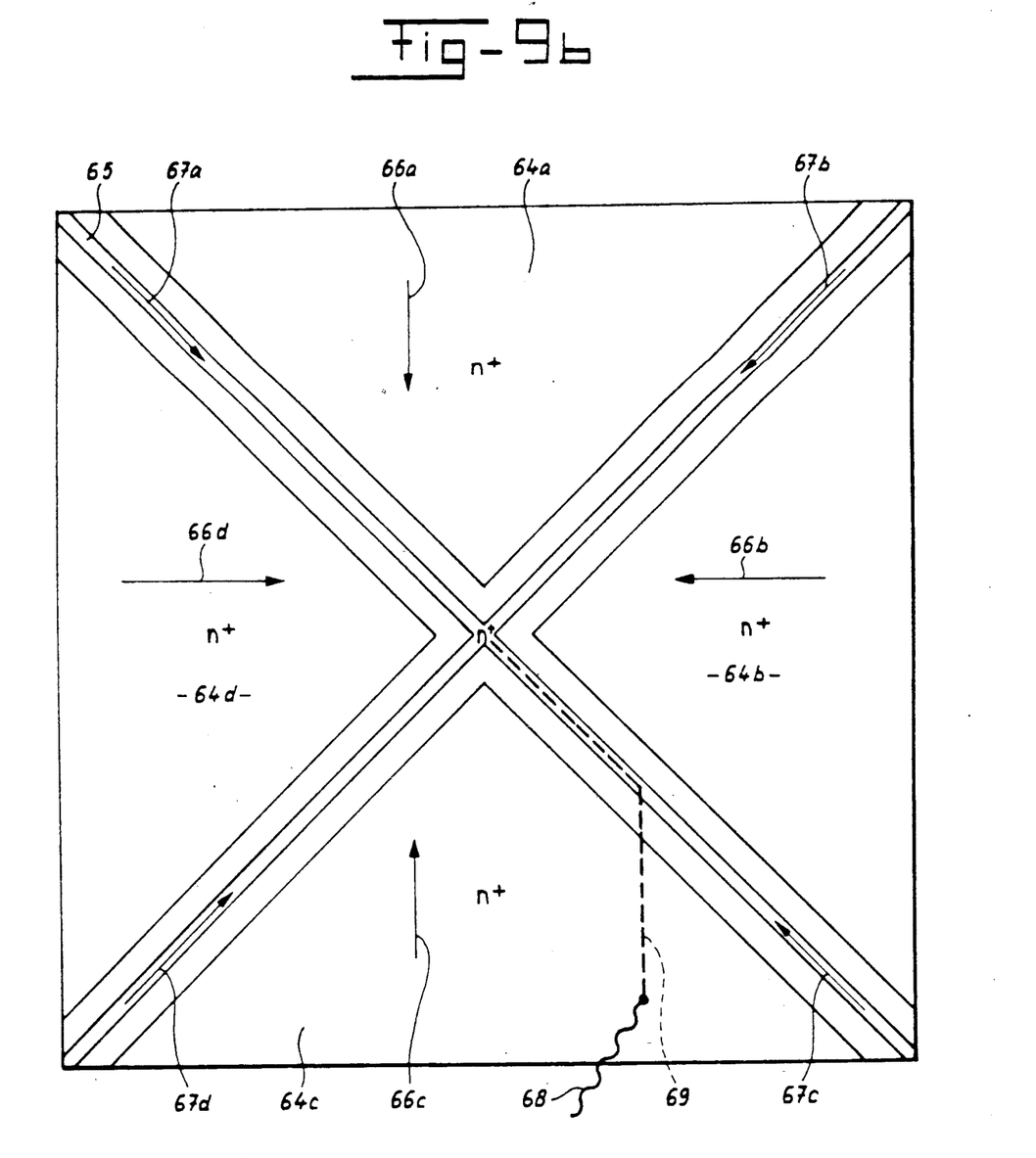

The structure of FIG. 8 can also be extended by mirror imaging to form a composite structure in the manner shown in FIG. 9a and 9b. The drift electrodes 62a .... 62n, which are provided in the top surface of the wafer of semiconductor material 61, have the shape of concentric squares positioned around the centrally situated detection region 63. The electrodes on the bottom surface of the wafer 61 comprise the triangular electrode region 64a .... 64d and the X-shaped region 65. As will be clear after discussing the embodiment in FIG. 8, if suitably chosen voltages are applied to the diverse electrodes, drift fields whose directions are indicated by the arrows 66a.... 66d and 67a.... 67d are generated in the depleted semiconductor wafer.

If radiation 68 impinges on this structure as shown in FIG. 9b the electrons released in this process will be captured by the electrode 64c in the manner already discussed, while the holes will start to move via the path indicated by the broken line 69 and will ultimately be captured by the centrally situated detection region 63.

Detectors of the type described above can be used to detect diverse types of radiation such as light radiation, UV radiation, X-ray radiation, gamma radiation, elementary particles etc.

We claim:

1. Position-sensitive radiation detector provided with a semiconductor structure comprising:

a wafer of semiconductor material of a first conductivity type having two principal surfaces situated at relatively short distances from each other, having a length and width which are of sufficient magnitude so the wafer may enclose the desired radiation detection surface, an electrode structure composed of one or more strip-type electrode regions of a second conductivity type in the first principal surface and at least one electrode region of the second conductivity type in an oppositely situated part of the second principal surface, voltages being applied, during operation, to electrodes of the electrode structure which are such that the part of the semiconductor wafer between the electrodes of the electrode structure is completely depleted and a drift field is generated in said depleted part of the electrode structure, a detection electrode region of the first conductivity type, provided in one of the principal surfaces, a voltage applied to which during operation is such that charge carriers generated by incoming radiation can be attracted to the detection electrode region by the drift field, a detector/amplifier circuit connected to the at least one electrode region in the oppositely situated part of the principal surface being designed to generate, during operation, a start signal indicating the generation of charge carriers at an instant at which charge carriers are generated in the depleted part of the structure as a consequence of incident radiation or incident elementary particles, and a detector/amplifier circuit connected to the detection electrode region being designed to emit, during operation, a stop signal at the instant when charge carriers reach the detection electrode region via the drift field, characterized in that the semiconductor structure further comprises:

at least one further electrode structure composed of one or more electrode regions of the second conductivity type in the first principal surface and at least one electrode region of the second conductivity type in the oppositely situated part of the second principal surface, voltages being applied, during operation, to the electrodes of the further electrode structure, which voltages are such that the part of the semiconductor wafer material between the electrodes of the further electrode structure is completely depleted and a further drift field is generated in said depleted part of the structure, the two drift fields making a predetermined angle with each other and the further electrode structure being positioned with respect to the first mentioned electrode structure and with respect to the detection electrode region in a manner such that charge carriers originating from the drift field within the first mentioned electrode structure will be intercepted in the drift field within the further electrode structure and will be able to reach the detection electrode region via said further drift field.

2. Position-sensitive radiation detector according to claim 1, characterized in that said electrode regions of the second conductivity type in the first principal surface, associated with the further electrode structure, are constructed as small islands or pixel regions and the electrode region of the second conductivity type in the oppositely situated part of the second principal surface, associated with the further electrode structure, is constructed as a strip-type region.

3. Position-sensitive radiation detector according to claim 2, characterized in that the electrode region of the second conductivity type in the oppositely situated part of the second principal surface and associated with the further electrode structure is connected, during operation, to a detector/amplifier circuit designed to emit an intermediate time signal at the instant at which charge carriers moving through the drift field reach said electrode region of the second conductivity type in the oppositely situated part of the second principle surface.

4. Position-sensitive radiation detector according to claim 2, characterized in that the electrode region of the second conductivity type in the second principal surface, associated with the first mentioned electrode structure, and the electrode region of the second conductivity type in the second principal surface, associated with the further electrode structure, are integrally combined.

5. Position-sensitive radiation detector according to claim 4, characterized in that a last strip-type electrode region in the first principal surface, viewed in a direction of movement of the charge carriers and associated with the first mentioned electrode structure, is connected, during operation, to a detector/amplifier circuit designed to emit an intermediate time signal at the instant at which charge carriers moving through the drift field reach said last strip-type electrode region.

6. Position-sensitive radiation detector provided with two structures as described in claim 2, characterized in that both structures are constructed as mirror images and in a manner such that the further electrode structure as well as the detection electrode are positioned on a first axis of symmetry and are jointly utilized by both structures.

7. Position-sensitive radiation detector provided with two structures as described in claim 6, characterized in that both structures are constructed as mirror images and in a manner such that the strip-type electrode regions of all the first mentioned electrode structures run parallel to one another and a second axis of symmetry runs perpendicularly to the first axis of symmetry through a centrally positioned detection electrode region.

8. Position-sensitive radiation detector according to claim 7, characterized in that the electrode regions of the second conductivity type in the second principal surface, associated with the diverse structures, form an integrated whole.

9. Position-sensitive radiation detector according to claim 1, characterized in that the further electrode structure is composed of strip-type electrode regions similar to the first mentioned electrode structure, in that the strip-type electrode regions of the first mentioned electrode structure make an angle with the strip-type electrode regions of the further electrode structure such that the strip-type electrodes of both structures are connected to one another in pairs to form angled electrodes, the apexes being situated on a diagonal such that the electrodes of the second conductivity type in the second principal surface are composed of a strip-type electrode under said diagonal as well as integrated electrode regions under remaining parts of the strip-type electrode regions, and that a detection electrode is used which is positioned near the apex of a last angled electrode, viewed in the drift direction.

10. Position-type radiation detector provided with a multiplicity of structures as described in claim 9, which structures each mutually make a predetermined angle with one another in the manner described and adjoin one another in a manner such that the sum of the angles is 360°, a single detection electrode being used in the centre of the structure.

11. Position-sensitive radiation detector according to claim 10, characterized in that the said predetermined angle is equal to 90°, 12. Position-sensitive radiation detector according to claim 11, characterized in that the semiconductor material of the first conductivity type is of the p-type.

* * * * *